United States Patent
Cui et al.

(10) Patent No.: US 12,038,461 B2
(45) Date of Patent: Jul. 16, 2024

(54) INTELLIGENT ELECTRONIC DEVICE AND METHOD THEREOF

(71) Applicant: Accuenergy (Canada) Inc., Toronto (CA)

(72) Inventors: Shaohang Cui, Toronto (CA); Ketao Li, Toronto (CA); Haoliang Deng, Toronto (CA); Yufan Wang, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 197 days.

(21) Appl. No.: 17/836,166

(22) Filed: Jun. 9, 2022

(65) Prior Publication Data

US 2023/0400484 A1    Dec. 14, 2023

(51) Int. Cl.
*G01R 21/133* (2006.01)

(52) U.S. Cl.
CPC ............... *G01R 21/1331* (2013.01)

(58) Field of Classification Search
CPC ............ G01R 21/1331; G01R 19/2513; G01R 21/133; G01D 4/002; Y02B 70/30
See application file for complete search history.

(56) References Cited

U.S. PATENT DOCUMENTS

| | | | | |
|---|---|---|---|---|
| 5,717,325 A * | 2/1998 | Leeb | ................. | G01R 21/1331 324/76.12 |
| 6,185,508 B1 * | 2/2001 | Van Doorn | ........ | G01R 21/1331 702/60 |
| 6,522,982 B1 * | 2/2003 | Pastorello | ................. | G06J 1/00 324/110 |
| 8,219,334 B2 | 7/2012 | Robinson et al. | | |
| 9,020,771 B1 | 4/2015 | Hardy | | |
| 9,143,141 B2 | 9/2015 | Fan et al. | | |
| 2011/0295912 A1 * | 12/2011 | Sanchez Loureda | .. | G01D 4/004 707/812 |
| 2012/0310569 A1 * | 12/2012 | Fan | ........................ | G01R 23/15 702/70 |
| 2013/0275066 A1 * | 10/2013 | Spanier | ................. | G01R 23/20 702/61 |
| 2016/0103163 A1 * | 4/2016 | Schamber | .............. | G01D 4/002 702/61 |
| 2019/0049493 A1 * | 2/2019 | Dent | ................... | G01R 19/2506 |

* cited by examiner

*Primary Examiner* — Akm Zakaria
(74) *Attorney, Agent, or Firm* — Dhiraj Jindal; PATENT YOGI LLC

(57) ABSTRACT

A method and apparatus generate an energy pulse output while improving the accuracy of energy pulse output. Specifically, an Intelligent Electronic Device employs a method in which a processor receives digital electrical parameter data to at least two buffers alternately; compute a power value in a full zero-crossing cycle in accordance with the digital electrical parameter data when one of the at least two buffers gets fully filled and storing the power value; divide a period that each buffer takes from empty to getting fully filled into a series of intervals; calculate energy consumption in each interval based on the power value stored; totalize the energy consumption; generate an energy pulse output according to a pre-determined threshold and the totalized energy consumption.

8 Claims, 7 Drawing Sheets

INTELLIGENT ELECTRONIC DEVICE AND METHOD THEREOF

FIELD OF THE INVENTION

The present disclosure generally relates to the field of Intelligent Electronic Devices for electrical utility services and, more specifically, to digital electrical power and energy meters for use in performing electrical utility services.

BACKGROUND

Monitoring electrical energy is a fundamental function within any electrical power distribution system. Electrical energy may be monitored to determine usage and power quality. A device that monitors electrical energy may be an Intelligent Electronic Device (IED). In the IED, an energy pulse output corresponds to a defined amount of energy passing through the IED (e.g., kWh).

The energy pulse output algorithm is embedded within RMS (Root Mean Square) calculation loop in the prior art. Thus, the energy accumulated is updated at least one electrical signal cycle. For example, in a 60 Hz electrical distribution system, each electrical signal cycle is 16 ms. However, the buffers containing the digital signal data from the A/D converter are updated with a different period, such as 10 ms. A 1-2 buffer update cycle may be needed to finish the energy accumulated calculation. It may affect the accuracy of energy pulse output. The details will be discussed later in a combination of FIG. 4.

Therefore, further improvements to Intelligent Electronic Devices would be desirable.

SUMMARY

The present disclosure relates to an intelligent electronic device (IED) comprising at least one sensor configured for sensing at least one electrical parameter of electrical power distributed from an electrical distribution system to a load, at least one analog-to-digital converter coupled to the at least one sensor and configured for converting an analog signal output from the at least one sensor to digital data, and at least one processing module coupled to the at least one analog-to-digital converter and configured to receive digital electrical parameter data to at least two buffers alternately, compute a power value in a full zero-crossing cycle in accordance with the digital electrical parameter data when one of the at least two buffers gets fully filled and storing the power value divide a period that each buffer takes from empty to getting fully filled into a series of intervals, calculate energy consumption in each interval based on the power value stored, totalize the energy consumption, and generate an energy pulse output according to a pre-determined threshold and the totalized energy consumption.

In some embodiments of the device, the digital electrical parameter data include at least one of a phase voltage data or a phase current data.

In some embodiments of the device, the step that computes the power value in the full zero-crossing cycle in accordance with the digital electrical parameter data when the one of the at least two buffers gets fully filled includes determining whether electrical parameter data with a full zero-crossing cycle exist when one of the at least two buffers gets fully filled, and computing a power value if the electrical parameter data with a full zero-crossing cycle exist when one of the at least two buffers gets fully filled.

In some embodiments of the device, the power value is one of an active power value, a reactive power value, and an apparent power value.

In some embodiments of the device, the means for dividing a period that each buffer takes from empty to getting fully filled into a series of intervals includes setting at least one timer in a period that each buffer takes from empty to getting fully filled and triggering an interrupt when the at least one timer expires.

The disclosure further relates to a method for generating an energy pulse output in an IED. The method comprising receiving digital electrical parameter data to at least two buffers alternately, computing a power value in a full zero-crossing cycle in accordance with the digital electrical parameter data when one of the at least two buffers gets fully filled and storing the power value, dividing a period that each buffer takes from empty to getting fully filled into a series of intervals, calculating energy consumption in each interval based on the power value stored, totalizing the energy consumption, and generating an energy pulse output according to a pre-determined threshold and the totalized energy consumption.

In some embodiments of the method, the digital electrical parameter data include at least one of phase voltage data and phase current data.

In some embodiments of the method, the step of computing the power value in a full zero-crossing cycle in accordance with the digital electrical parameter data when one of the at least two buffers gets fully filled includes determining whether electrical parameter data with a full zero-crossing cycle exists when one of the at least two buffers gets fully filled, and computing a power value if the electrical parameter data with a full zero-crossing cycle exists when one of the at least two buffers gets fully filled.

In some embodiments of the method, a power value is one of an active power value, a reactive power value, and an apparent power value.

In some embodiments of the method, the step of dividing the period that each buffer takes from empty to getting fully filled into a series of intervals includes setting at least one timer in a period that each buffer takes from empty to getting fully filled and triggering an interrupt when the at least one timer expires.

DETAILED DESCRIPTION

Embodiments of the present disclosure can be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be constructed as preferred, or advantageous, over other configurations or designs. Herein the phrase "coupled" can be defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

As used herein, Intelligent Electronic Devices ("IEDs") can be any device that can sense electrical parameters and can compute data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

Figure 1:
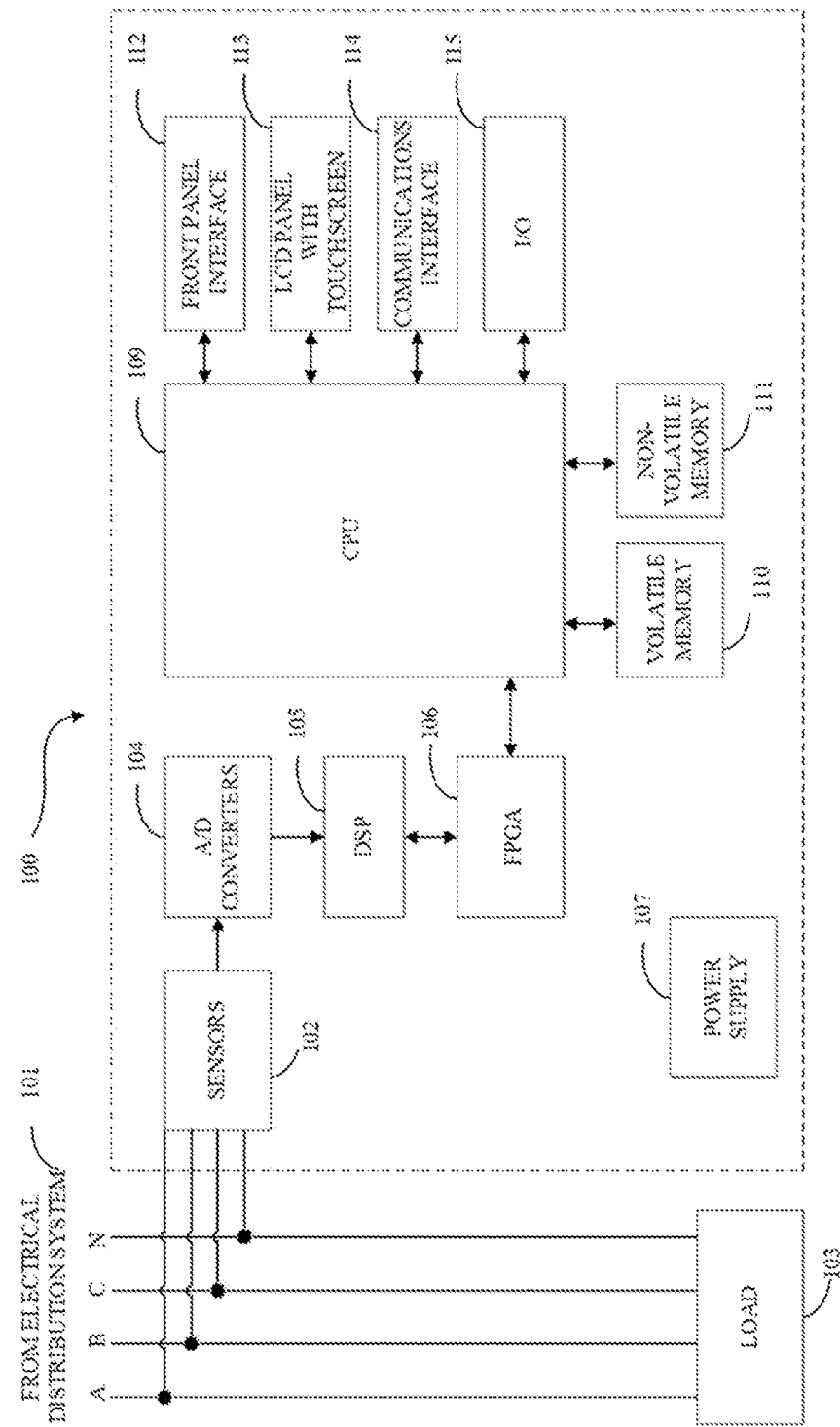
FIG. 1 is a block diagram of an exemplary Intelligent Electronic Device.

FIG. 1 is an exemplary embodiment of a block diagram of an Intelligent Electronic Device (IED) 100 for monitoring power usage and power quality for any metered point within a power distribution system.

The exemplary IED 100 illustrated in FIG. 1 can include multiple sensors 102 coupled with various phases A, B, C, and N (neutral) of an electrical distribution system 101, multiple analog-to-digital (A/D) converters 104, a power supply 107, a volatile memory 110, a non-volatile memory 111, a front panel interface 112, and a processing module that can include at least one Central Processing Unit (CPU) and/or one or more Digital Signal Processors (DSP), two of which are shown DSP 105 and CPU 109. The LED 100 can also include a Field Programmable Gate Array (FPGA) 106 which can perform several functions including acting as a communications bridge for transferring data between the various processors (105 and 109).

The sensors 102 sense electrical parameters, such as voltage and current, on incoming lines (phase A, phase B, phase C, and neutral N) of an electrical power distribution system 101 coupled to at least one load 103 that may consume the provided power. In one embodiment, the sensors 102 include current transformers and potential transformers, where one current transformer and one voltage transformer can be coupled to each phase of the incoming power lines. The primary winding of each transformer can be coupled to the incoming power lines, and the secondary winding of each transformer can output a voltage representative of the sensed voltage and current. The output of each transformer can be coupled with the A/D converters 104, which can be configured to convert the analog voltage output from the transformer to a digital signal that can be processed by the DSP 105.

A/D converters 104 can be configured to convert an analog voltage output to a digital signal that can be transmitted to a gate array, such as Field Programmable Gate Array (FPGA) 106. The digital signal can then be transmitted from the FPGA 106 to the CPU 109.

The CPU 109 or DSP Processors 105 can be configured to receive digital signals from the A/D converters 104 and perform the necessary calculations to determine power usage and control the overall operations of the IED 100. In some embodiments, the CPU 109 and the DSP 105 may be combined into a single processor to serve the functions of each component. In some embodiments, it may be contemplated to use an Erasable Programmable Logic Device (EPLD), a Complex Programmable Logic Device (CPLD), or any other programmable logic device in place of the FPGA 106. In some embodiments, the digital samples, which can be output from the A/D converters 104, can be sent directly to the CPU 109, effectively bypassing the DSP 105 and the FPGA 106 as a communications gateway.

The power supply 107 provides power to each component of the IED 100. In one embodiment, the power supply 107 can be a transformer with its primary windings coupled to the incoming power distribution lines to provide a nominal voltage at its secondary windings. In other embodiments, power may be supplied from an independent power source to the power supply 107.

In the exemplary embodiment of FIG. 1, the front panel interface 112 is shown coupled to the CPU 109, which can include indicators, switches, and various inputs.

In the embodiment of FIG. 1, the LCD panel with touchscreen 113 is shown coupled to the CPU 150 for interacting with a user and for communicating events, such as alarms and instructions. The LCD panel with touchscreen 113 may provide information to the user in the form of alpha-numeric lines, computer-generated graphics, videos, animations, etc.

An Input/Output (I/O) interface 115 may be provided for receiving externally generated inputs from the IED 100 and for outputting data, such as serial data, to other devices. In one embodiment, the I/O interface 115 may include a connector for receiving various cards and/or modules that increase and/or change the functionality of the IED 100. In a further embodiment, the I/O interface 115 may include digital output for energy pulse.

The IED 100 can also include volatile memory 110 and non-volatile memory 111. The volatile memory 110 can store the sensed and generated data for further processing and for retrieval when requested to be displayed at the IED 100 or from a remote location. The volatile memory 110 can include an internal storage memory, such as Random-Access Memory (RAM). The non-volatile memory 111 can include a removable memory, such as magnetic storage memory, an optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or can exist in the future. Such memory can be used for storing historical trends, waveform captures, event logs (including timestamps), and stored digital samples for later download to a client application, webserver, or PC application.

In a further embodiment, the IED 100 can include a communication interface 114, also known as a network interface, for enabling communications between the IED, or meter, and a remote terminal unit or programmable logic controller and other computing devices, microprocessors, desktop computers, laptop computers, other meter modules, etc. The communication interface 114 may be a modem, Network Interface Card (NIC), wireless transceiver, or other interface. The communication interface 114 can operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocol, communication architecture, or systems currently existing or to be developed for wirelessly transmitting data.

The IED 100 may communicate to a server or other computing device via the communication interface 114. The IED 100 may be connected to a communications network (such as the Internet) by any means. For example, a hard-wired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server can communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocol. The server may further include a storage medium for storing the data received from at least one IED or meter and/or storing data to be retrieved by the IED or meter.

In an additional embodiment, when a power event occurs, such as a voltage surge, voltage sag, or current short circuit, the IED 100 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform can also allow the CPU 109 to compute other electrical parameters such as harmonics, magnitudes, symmetrical components, and phasor analysis.

In a further embodiment, the IED 100 can execute an e-mail client and can send notification e-mails to the utility or directly to the customer when a power quality event occurs. This allows utility companies to dispatch crews to repair the condition. The data generated by the meters can be used to diagnose the cause of the condition. The data can be transferred through the infrastructure created by the electrical power distribution system. The e-mail client can utilize POP3 or another standard e-mail protocol.

The techniques of the present disclosure can be used to automatically maintain program data and provide field-wide updates upon which IED firmware and/or software can be upgraded. An event command can be issued by a user, on a schedule, or through a digital communication that can trigger the IED 100 to access a remote server and obtain the new program code. This can ensure that program data can be maintained, assuring the user that all information can be displayed identically on all units.

It is to be understood that the present disclosure may be implemented in various forms of hardware, software, firmware, special purpose processors, or a combination thereof. The IED 100 can also include an operating system and application programs. The various processes and functions described herein may either be part of an application program (or a combination thereof) which can be executed via the operating system.

Because some of the system components and methods depicted in the accompanying figures may be implemented using either software or firmware, it is to be further understood that the actual connections between the system components (or the process steps) may differ depending on the specific way the present disclosure can be programmed. Given the teachings of the present disclosure provided herein, one of ordinary skill in the related art can be able to contemplate these and similar implementations or configurations of the present disclosure.

Figure 2:
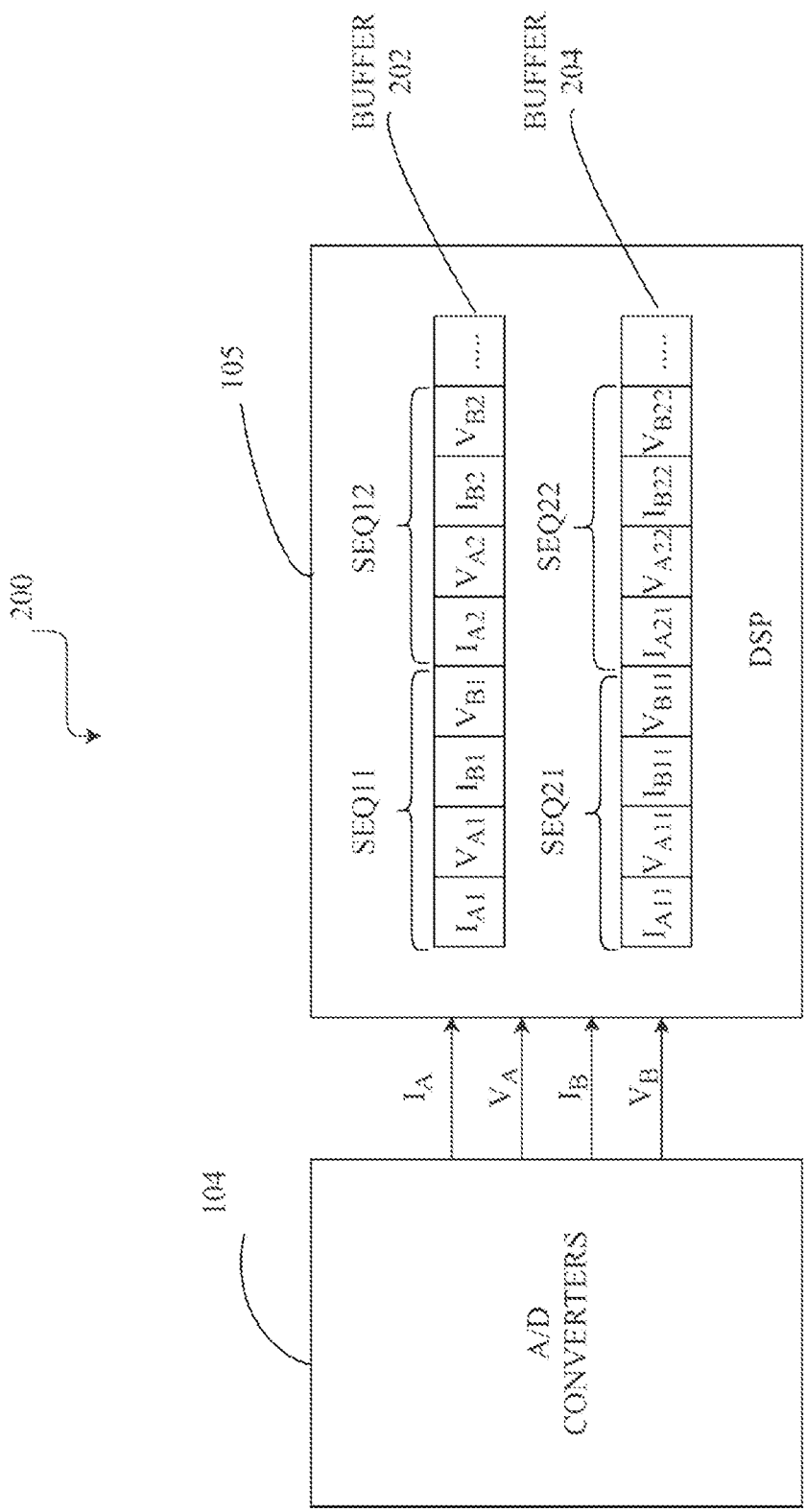
FIG. 2 is a diagram of exemplary buffers.

FIG. 2 can now be discussed, which depicts exemplary buffers in the DSP 105. There are two buffers shown, the buffer 202 and the buffer 204. A/D converters 104 can be configured to convert analog signals to digital signals. The digital signal converted may be a digital phase voltage signal or digital phase current signal. $I_A$ and $I_B$ may be digital phase current signals. $V_A$ and $V_B$ may be digital phase voltage signals. The buffer 202 and the buffer 204 may be circular buffers that trigger an interrupt when a circular buffer becomes full.

Generally, the buffer 202 and the buffer 204 may work alternately. For example, empty the buffer 202 can receive digital signal data from A/D converters 104 for a period of 10 milliseconds when it becomes full. Then the buffer 202 may trigger an interrupt and may stop receiving the digital signals. The incoming digital signals can be switched to the buffer 204. The data in the buffer 202 may be processed by the interrupt handler. After the data is processed completely, the buffer 202 may be cleared and can become empty again.

The buffer 204 may start to receive the incoming digital signal when the buffer 202 may stop receiving data. Empty the buffer 204 can also receive digital signal data from A/D converters 104 for a period of 10 milliseconds when it becomes full. Then the buffer 204 may trigger an interrupt and may stop receiving the digital signals. The digital signals can be switched to the buffer 202 again. The data in the buffer 204 may be processed by the interrupt handler. After the data is processed, the buffer 204 may be cleared and can become empty again.

It should be noted that only two buffers alternately working can be described in FIG. 2. More than two buffers may work alternately in this case.

Generally, the A/D converters 104 may have many channels. The digital signals from different channels can be multiplexed to output from the A/D converters 104. For example, in the buffer 202, there can be many data sequences such as seq11, seq12. Seq11 may include digital signals such as $I_{A1}$, $V_{A1}$, $I_{B1}$, $V_{B1}$ for a period. Seq12 may include digital signals such as $I_{A2}$, $V_{A2}$, $I_{B2}$, $V_{B2}$ for another consecutive period.

Figure 3:
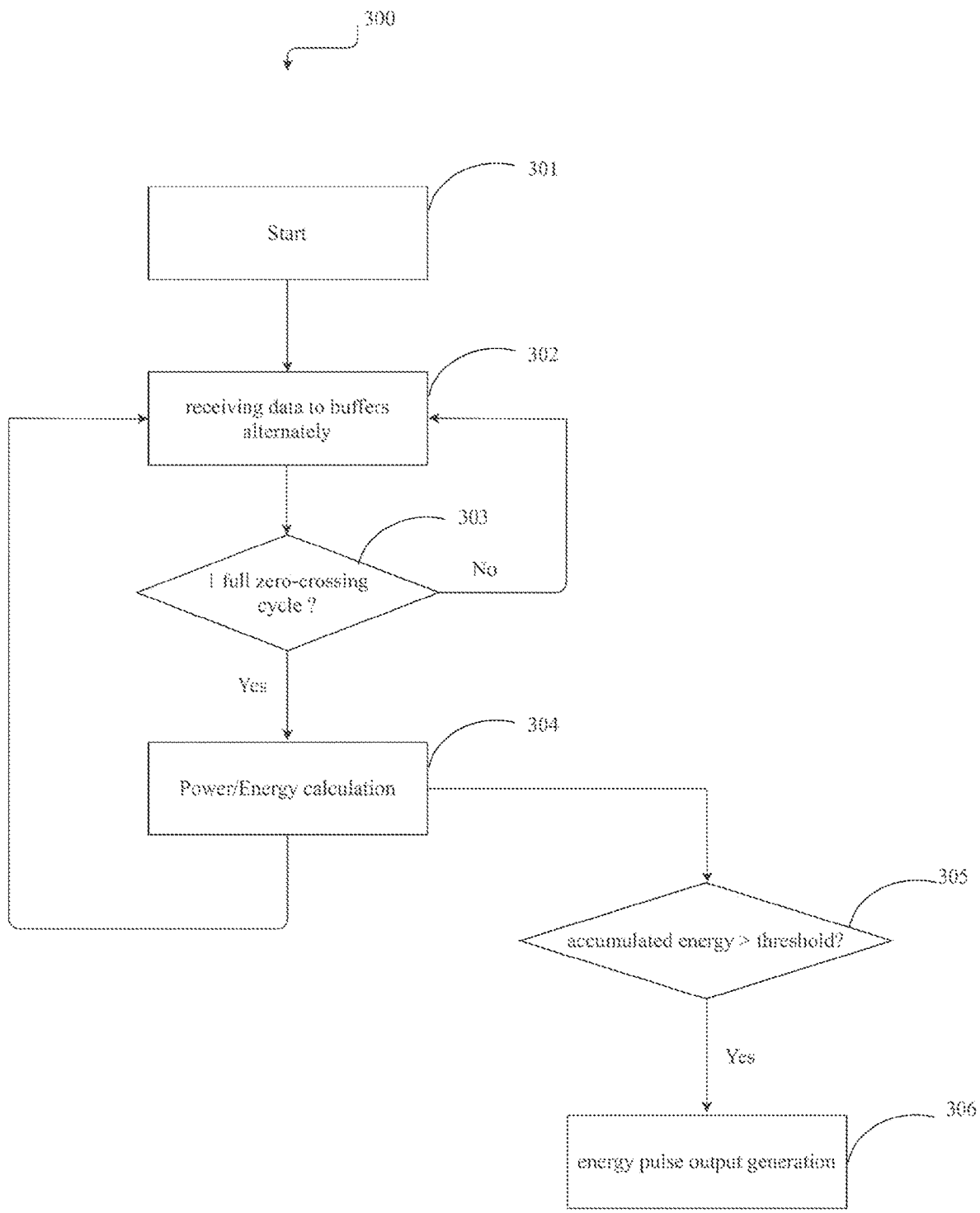
FIG. 3 is a flow chart illustrating a method of energy pulse output generation according to the prior art.

FIG. 3 can now be discussed, which illustrates a flow chart of an exemplary process 300 in accordance with the prior art.

In step 301, the IED 100 may start to work.

In step 302, the DSP 105 can receive digital electrical parameter data to at least two buffers (e.g., the buffer 202, the buffer 204) alternately from A/D converters 104.

In step 303, the DSP 105 can determine whether electrical parameter data with a full zero-crossing cycle can be included in one buffer (e.g., one of the buffer 202 and the buffer 204) getting fully filled. The full zero-crossing cycle can be discussed later. If electrical parameter data with a full zero-crossing cycle is not included in one buffer getting fully filled, the DSP 105 can execute step 302.

In step 304, the DSP 105 can calculate the power value and energy value in a full zero-crossing cycle if electrical parameter data with a full zero-crossing cycle can be included in one buffer getting fully filled. The power value may be one value of apparent power, active power and reactive power. After the calculation, the DSP 105 can execute step 302.

Voltage root mean square ($V_{rms}$) for each phase in a full zero-crossing cycle can be measured and calculated from the electrical parameter data. The following equation shows how the $V_{rms}$ can be calculated:

$$V_{rms} = \sqrt{\frac{1}{N}\sum_{i=0}^{N-1} V_{pi}^2}$$

Where N represents the number of samples in one full zero-crossing cycle, $V_{pi}$ represents ith phase voltage.

Similar to $V_{rms}$, the current root mean square (Inns) for each phase can also be calculated as the following equation:

$$I_{rms} = \sqrt{\frac{1}{N}\sum_{i=0}^{N-1} I_{pi}^2}$$

Where N represents the number of samples in one full zero-crossing cycle, $I_{pi}$ represents ith phase current.

Apparent power($S_t$) can be calculated as follows:

$$S_t = V_{rms} \times I_{rms}$$

Active power ($P_t$) can be calculated as the following equation:

$$P_t = \frac{1}{N}\sum_{i=0}^{N-1} V_{pi}I_{pi}$$

Where N represents the number of samples in one full zero-crossing cycle, $I_{pi}$ represents ith phase current, $V_{pi}$ represents ith phase voltage.

Reactive power ($Q_t$) can be calculated as follows:

$$Q_t = \sqrt{S_t^2 - P_t^2}$$

DSP 105 can calculate the energy according to the power value stored.

Apparent energy ($E_t$) can be calculated as following:

$$E_t = S_t \times T = V_{rms} \times I_{rms} \times T = \sqrt{\frac{1}{N}\sum_{i=0}^{N-1} V_{pi}^2} \times \sqrt{\frac{1}{N}\sum_{i=0}^{N-1} I_{pi}^2} \times N \times \nabla_t$$

$$E_t = \frac{1}{N}\sqrt{\sum_{i=0}^{N-1} V_{pi}^2} \times \sqrt{\sum_{i=0}^{N-1} I_{pi}^2} \times N \times \nabla_t$$

$$E_t = \sqrt{\sum_{i=0}^{N-1} V_{pi}^2} \times \sqrt{\sum_{i=0}^{N-1} I_{pi}^2} \times \nabla_t$$

Where T represents the time for one full zero-crossing cycle, N represents the number of samples in one full zero-crossing cycle, and $\nabla_t$ represents the time between two consecutive samples.

Active energy ($E_a$) can be calculated as follows:

$$E_a = P_t \times T = \frac{1}{N}\sum_{i=0}^{N-1} V_{pi}I_{pi} \times N \times \nabla_t$$

$$E_t = \sum_{i=0}^{N-1} V_{pi}I_{pi} \times \nabla_t$$

Where T represents the time for one full zero-crossing cycle, N represents the number of samples in one full zero-crossing cycle, and $\nabla_t$ represents the time between two consecutive samples.

Reactive energy ($E_r$) can be calculated as follows: $E_r = Q_t \times T = \sqrt{S_t^2 - P_t^2} \times T$ Where T represents the time for one full zero-crossing cycle.

In step 305, the DSP 105 can determine whether the accumulated energy exceeds the pre-determined threshold.

In step 306, the DSP 105 can generate an energy output if the accumulated energy exceeds the pre-determined threshold.

Figure 4:
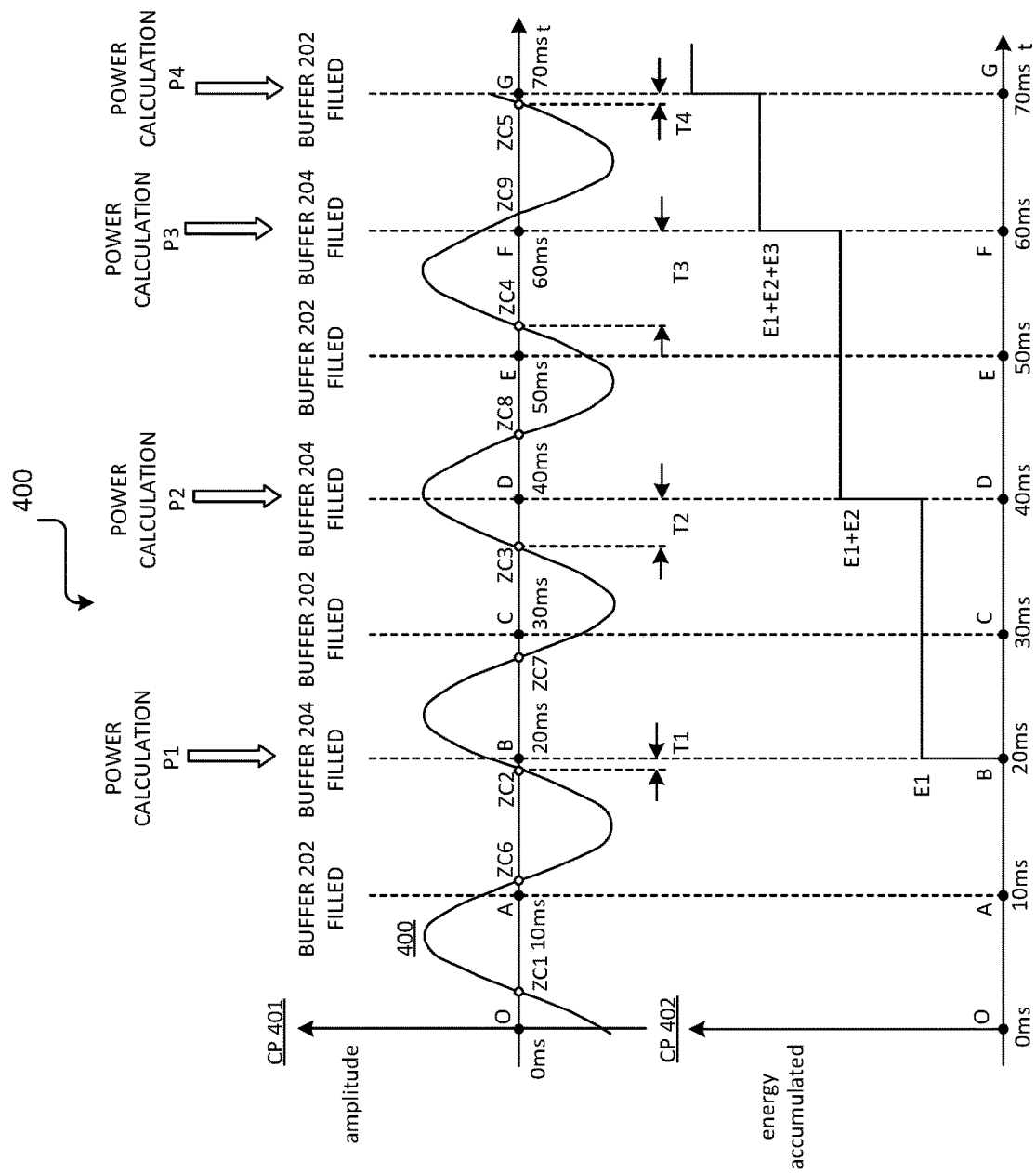
FIG. 4 is a graph illustrating energy pulse output generation corresponding to FIG. 3.

FIG. 4 can now be discussed, which illustrates an exemplary waveform corresponding to FIG. 3. There can be two coordinate planes: the CP 401 and the CP 402 in FIG. 4. In this embodiment, both the CP 401 and the CP 402 may have the same x-axis which represents time, the y-axis in the CP 401 represents the amplitude of sine wave 403, and the y-axis in the CP 402 represents energy accumulated in IED 100.

In the CP401, the frequency of electrical signal sine wave 403 can be 60 Hz. At time point O (0 ms), the IED 100 may start to work. And the buffer 202 and the buffer 204 can be empty at this moment. The period for the buffer 202 or the buffer 204 getting fully filled from empty can be 10 ms. The period for the buffer 202 or the buffer 204 getting fully filled from empty can also be called a buffer update cycle. At time point A (10 ms), the buffer 202 can be fully filled. At time point B (20 ms), the buffer 204 can be fully filled. At time point C (30 ms), the buffer 202 can be fully filled. At time point D (40 ms), the buffer 204 can be fully filled. The buffer 202 and the buffer 204 work alternately.

The IED 100 may start to work at the time point O. A full zero-crossing cycle can be the period between two consecutive zero crossing points with the same zero-crossing type. There can be two kinds of zero-crossing points. Type 1 can be the rising edge zero-crossing point. Type 2 can be the falling edge point. ZC1, ZC2, ZC3, ZC4, ZC5 can be a type 1 zero-crossing points. ZC6, ZC7, ZC8, ZC9 can be a type 2 zero-crossing points. The period between ZC1 and ZC2 can be a full zero-crossing cycle. The period between ZC2 and ZC3 can be another full zero-crossing cycle.

At the time point A (10 ms), when the buffer 202 is fully filled from empty, the DSP 105 can check whether there is a full zero-crossing cycle data collected. There can be no full zero-crossing data collected at time point A.

At the time point B (20 ms), when the buffer 204 is fully filled from empty, the DSP 105 can check whether there is a full zero-crossing cycle data collected. There can be a first full zero-crossing data (from ZC1 to ZC2) collected at the time point B. At time point B, the DSP 105 can calculate the power for the first full zero-crossing data and may obtain one power value, P1. In the CP402, the energy E1 for the first full zero-crossing data can also be calculated at time point B.

At the time point C (30 ms), the DSP 105 can check whether there is another full zero-crossing cycle data collected. There may be no full zero-crossing data collected at the time point C. In the CP402, the accumulated energy may be kept unchanged at the time point C.

At the time point D (40 ms), the DSP 105 can check whether there is another full zero-crossing cycle data collected. There may be a second full zero-crossing data (from ZC2 to ZC3) gathered at the time point D. At time point D, the DSP 105 can calculate the power for the second full zero-crossing data and may obtain one power value, P2. In the CP402, the energy E2 for the second full zero-crossing data can also be calculated at time point B. Thus, the accumulated energy is E1+E2 at time point D.

At the time point E (50 ms), the DSP 105 checks whether there is a full zero-crossing cycle data collected. There may be no full zero-crossing cycle data collected at 50 ms. In the CP402, the accumulated energy may be kept unchanged at the time point E.

At the time point F (60 ms), the DSP 105 can check whether there is a full zero-crossing cycle data collected. There is a third full zero-crossing data collected at the time point F (from ZC3 to ZC4). The DSP 105 can calculate the power for the third full zero-crossing data and may obtain one power value P3. In the CP 402, the energy E3 for the third full zero-crossing data can also be calculated at the time point F. The accumulated energy can be E1+E2+E3 at the time point F.

At the time point G (70 ms), the DSP 105 can check whether there is a full zero-crossing cycle data collected. There can be a fourth full zero-crossing data collected at the time point F (from ZC4 to ZC5). The DSP 105 can calculate the power for the fourth full zero-crossing data and may obtain one power value P4. In the CP402, the energy E4 for the fourth full zero-crossing data can also be calculated at the time point G. The accumulated energy can be E1+E2+E3+E4 at the time point G.

It can be observed that it takes 1-2 buffer update cycle (10 or 20 milliseconds) for the DSP 105 to calculate accumulated energy in the CP402. Therefore, this period may affect the energy pulse output accuracy.

Figure 5:
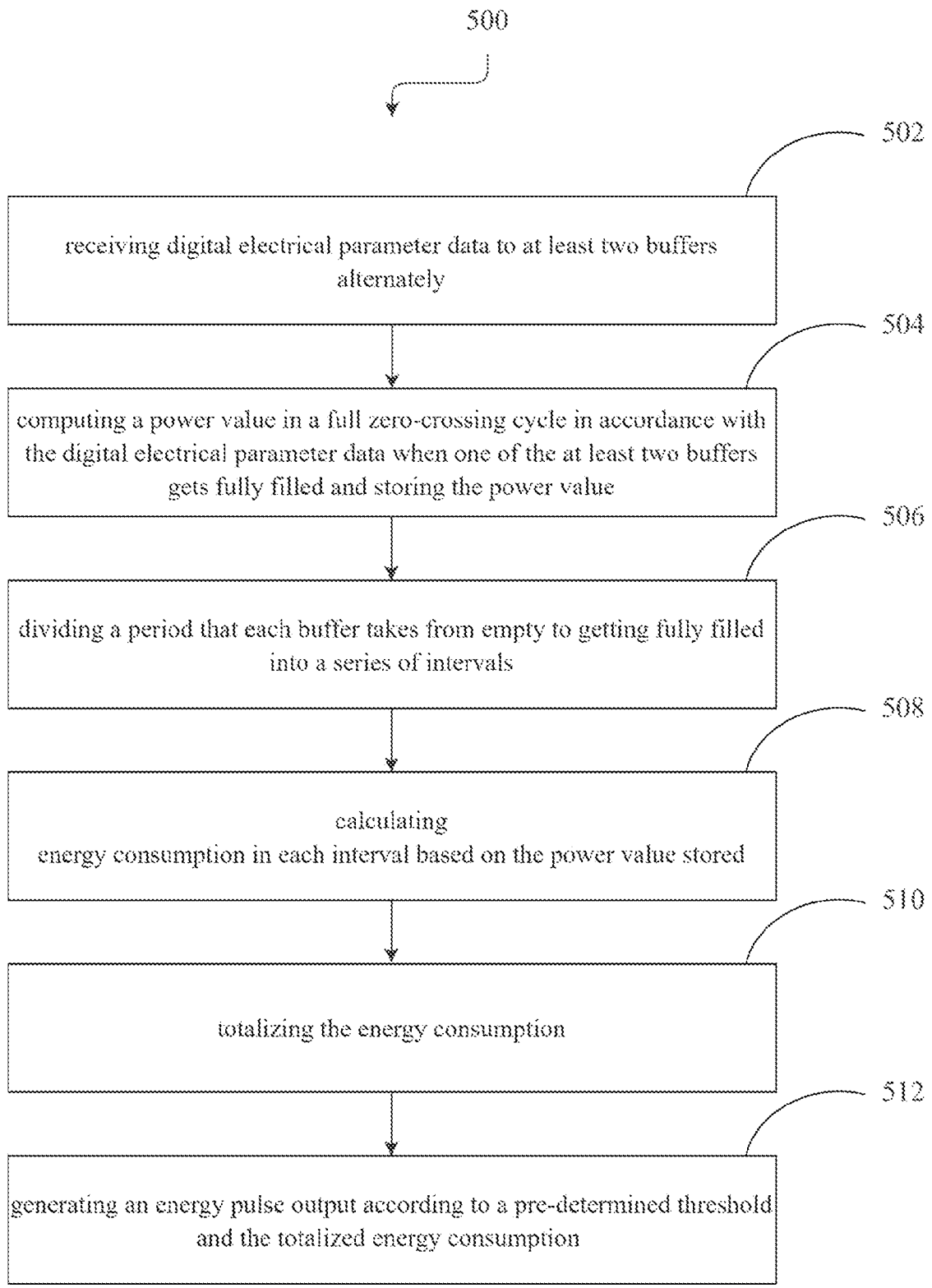
FIG. 5 is a flow chart illustrating a method of energy pulse output generation according to some aspects of the present disclosure.
Figure 6:
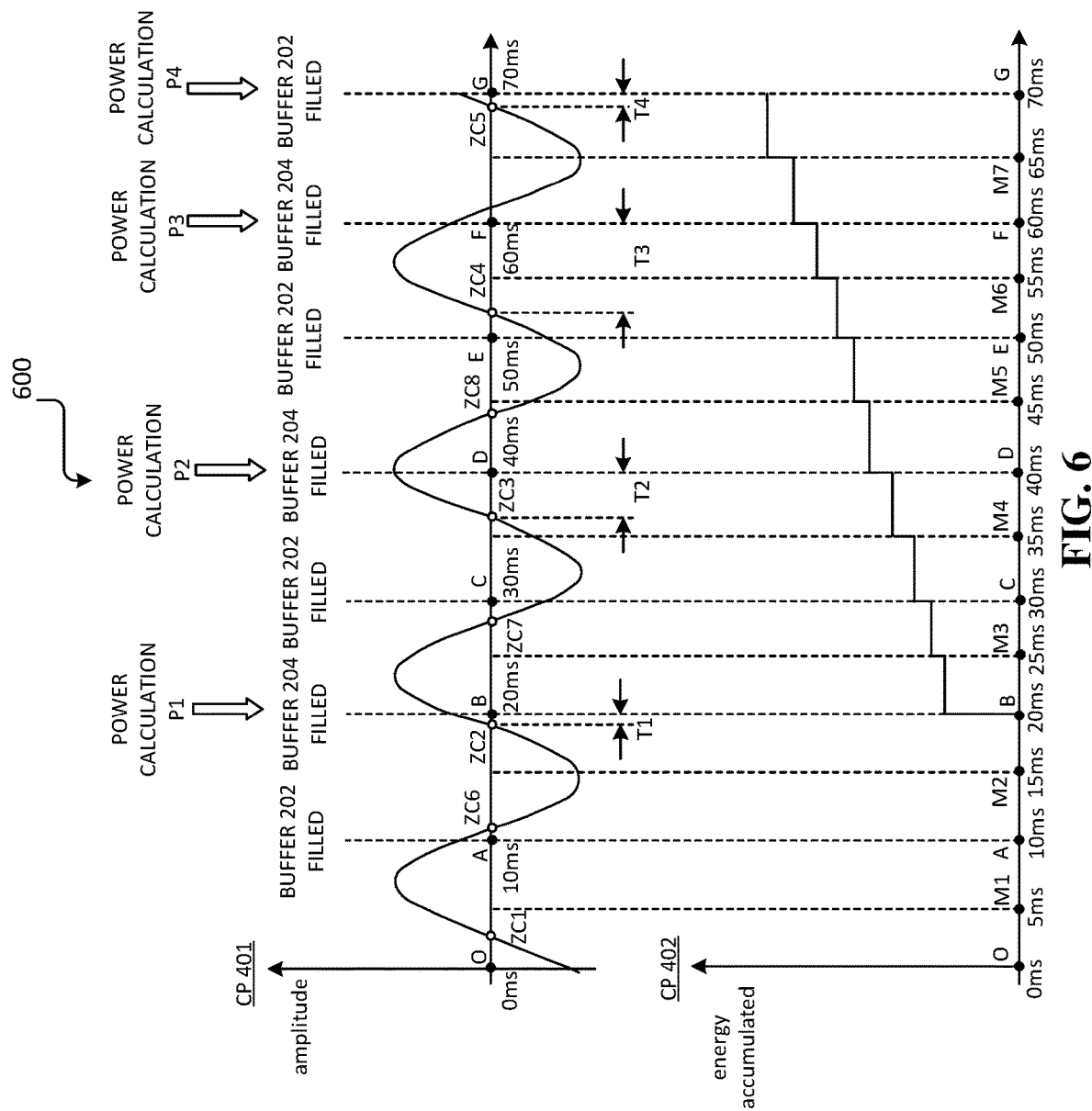
FIG. 6 is a graph illustrating energy pulse output generation corresponding to FIG. 5.

FIG. 5 can now be discussed, which illustrates an exemplary process in accordance with one embodiment. In step 502, the IED 100 can receive digital electrical parameter data to at least two buffers alternately. The digital electrical parameter data may be digital phase voltage data or digital phase current data as an output of ADC 104. The at least two buffers may be the buffer 202 and the buffer 204 in the DSP 105. In the embodiment of FIG. 6, and firstly, the buffer 202 may be fully filled at time point A (10 ms) from empty at time point O (0 ms). Secondly, the buffer 204 may be fully filled at time point B (20 ms) from empty at time point A (10 ms). The data in the buffer 202 can be processed during the period between time point A and B. The buffer 202 may be cleared at time point B (20 ms). Thirdly, the buffer 202 may be fully filled at time point C (30 ms) from empty at time point B (20 ms). It should be noted that FIG. 6 may be similar to FIG. 4. Please refer to FIG. 4 for detailed axis information.

In step 504, the IED 100 may compute a power value in a full zero-crossing cycle in accordance with the digital electrical parameter data when each buffer gets fully filled and storing the power value. In one embodiment, when one buffer, such as the buffer 202 or the buffer 204, gets fully filled, an interrupt can be generated. Upon receiving the interrupt, the power value can be calculated in an interrupt handler. The power value may be an active power value, a reactive power value, or an apparent power value. After the power value is calculated, it may be stored in volatile memory 110 or a register in the DSP 105.

In one embodiment, the IED 100 can determine whether electrical parameter data with a full zero-crossing cycle exist when one of the at least two buffers gets fully filled; the IED 100 can compute a power value if the electrical parameter data with a full zero-crossing cycle exist when one of the at least two buffers gets fully filled. After the power value is calculated, it may be stored in volatile memory 110 or a register in the DSP 105. If the electrical parameter data with a full zero-crossing cycle does not exist when one of the at least two buffers gets fully filled, the power value stored may remain unchanged.

Now referring to the example of FIG. 6, the IED 100 judges whether there is a full zero-crossing cycle included at time points A-G. At time point O, an initial power value 0 can be stored in memory or register because the IED 100 may be powering on at this moment. Since there may be no full zero-crossing cycle data gathered at time point A, a power value does not need to be calculated. At time point B, since there are one full zero-crossing cycle (ZC1-ZC2) data gathered, power value P1 can be calculated, and P1 can be stored. Since there may be no new, full zero-crossing cycle data gathered at time point C, a power value does not need to be calculated. At time point D, since there can be one new, full zero-crossing cycle ZC2-ZC3, a power value P2 can be calculated, and P2 can be stored. Since there may be no new full zero-crossing cycle data gathered at time point E, a power value does not need to be calculated. At time point F, since there can be one new, full zero-crossing cycle (ZC3-ZC4) data gathered, a power value P3 can be calculated, and P3 can be stored. At time point G, since there are new full zero-crossing cycle (ZC4-ZC5) data gathered, a power value P4 can be calculated, and P4 can be stored.

In step 506, the IED 100 may divide a period that each buffer takes from empty to getting fully filled into a series of intervals. In the example of FIG. 6: the period OA can be split into two intervals, OM1 and M1A. The period AB can be divided into two intervals, AM2 and M2B. The period BC can be divided into two intervals, BM3 and M3C. The period CD can be split into two intervals, CM4 and M4D. The period DE can be split into two intervals, DM5 and M5E. The period EF can be split into two intervals, EM6 and M6F. The period FG can be split into two intervals, FM6 and M6G. It should be noted that the period may be divided into more two intervals.

In one embodiment, the step of dividing a period that each buffer takes from empty to getting fully filled into a series of intervals can include: setting at least one timer in a period that each buffer takes from empty to getting fully filled; and triggering an interrupt when the at least one timer expires.

For example, in FIG. 6, timers can be set at the time points such as B, M3, C, M4, D, M5, E, M6. When the timer expires at the time points such as B, M3, C, M4, D, M5, an interrupt may be triggered. Step 508 may be executed in the interrupt context.

In step 508, the IED 100 can calculate energy consumption in each interval based on the power value stored.

For example, in FIG. 6 the energy consumption in the interval BM3 ($E_{BM3}$) may be calculated as follows:

$$E_{BM3} = P1 \times T_{BM3}$$

Where $T_{BM3}$ represents the period for BM3, P1 can be the power value stored during $T_{BM3}$.

The energy consumption in the interval M3C (EM3c) may be calculated as follows:

$$E_{M3C} = P1 \times T_{M3C}$$

Where $T_{M3C}$ represents the period for M3C, P1 can be the power value stored during $T_{M3C}$.

Similarly, the energy consumption in the other intervals in FIG. 6 may be calculated as follows:

$$E_{CM4}=P1\times T_{CM4}, E_{M4D}=P1\times T_{M4D}$$

$$E_{DM5}=P2\times T_{DM5}, E_{M5E}=P2\times T_{M5E}$$

$$E_{EM6}=P2\times T_{EM6}, E_{M6F}=P2\times T_{M6F}$$

$$E_{FM7}=P3\times T_{FM7}, E_{M7G}=P3\times T_{M7G}$$

In step 510, the IED 100 may totalize the energy consumption.

For example, in FIG. 6, the accumulated energy at the time point $G(E_G)$ can be calculated as follows:

$$E_G=E_B+E_{BM3}+E_{MC}+E_{CM4}+E_{M4D}+E_{DM5}+E_{M5E}+E_{EM6}+E_{M6F}+E_{FM7}+E_{M7G}$$

Where $E_B$ represents the energy for the first full zero-crossing cycle ZC1-ZC2.

Similarly, the accumulated energy at the time points such as D, E, F can be calculated.

Referring to the example of FIG. 6, the energy accumulated can be updated every 5 ms. The accuracy of energy accumulated at the time points such as D, E, F can be improved.

In step 512, the IED 100 can generate an energy pulse output according to a pre-determined threshold and the totalized energy consumption.

For example, if $E_G$ can be greater than the pre-determined threshold, an energy pulse output can be generated and output.

Figure 7:
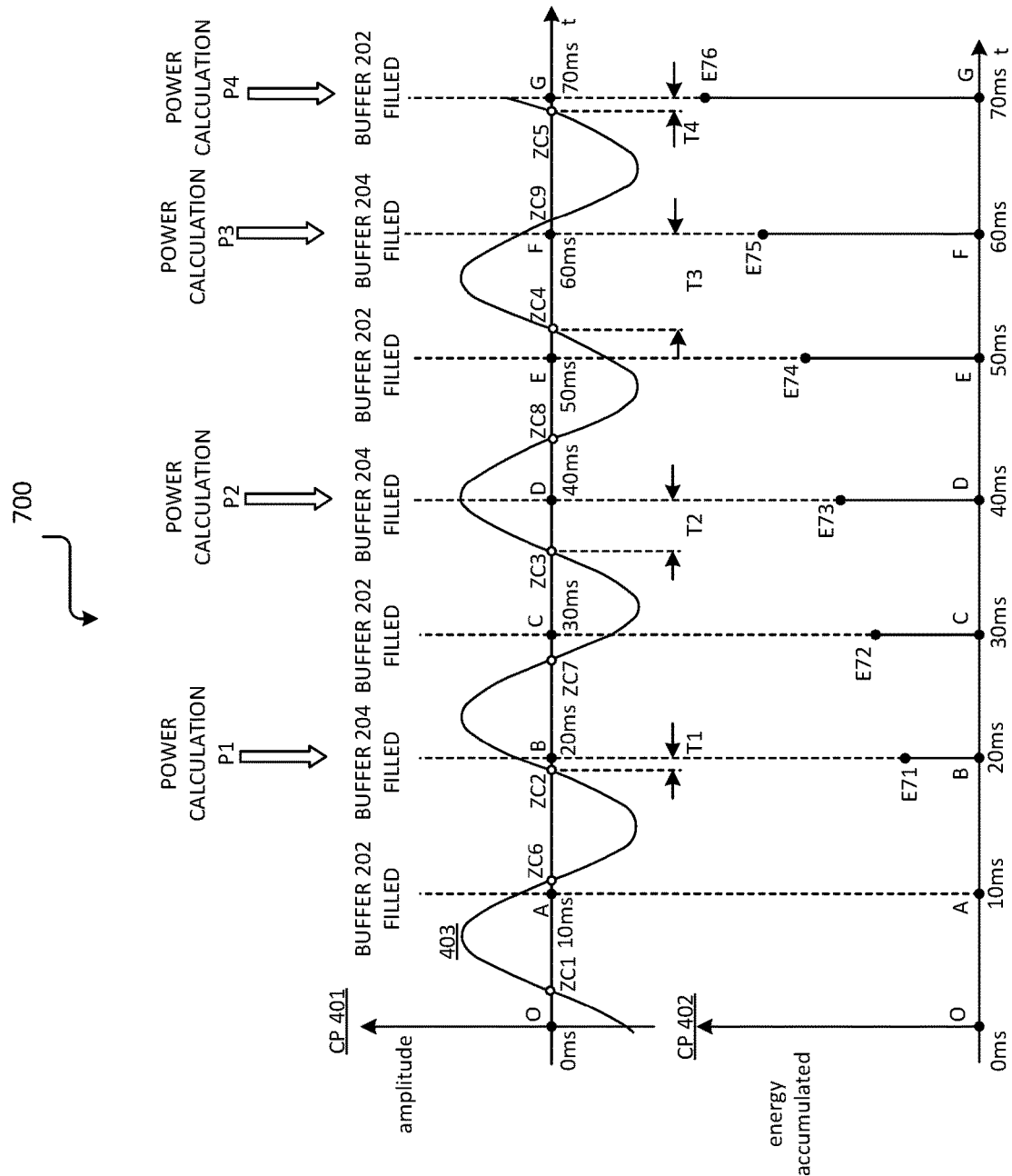
FIG. 7 is a graph illustrating the energy accumulated for various time points.

FIG. 7 can now be discussed, which illustrates an exemplary graph according to one embodiment. There can be two coordinate planes: the CP401 and the CP402 in FIG. 7. In this embodiment, both the CP401 and the CP402 may have the same x-axis which represents time, the y-axis in the CP401 represents the amplitude of sine wave 403, and the y-axis in the CP402 represents energy accumulated in the IED 100.

In the CP401, the frequency of electrical signal sine wave 403 can be 60 Hz. At time point O (0 ms), the IED 100 may start to work. The buffer 202 and the buffer 204 can be empty at this moment. The period for the buffer 202 or the buffer 204 getting fully filled from empty can be 10 ms. The period for the buffer 202 or the buffer 204 getting fully filled from empty can also be named as the buffer update cycle. At time point A (10 ms), the buffer 202 may be fully filled. At time point B (20 ms), the buffer 204 may be fully filled. At time point C (30 ms), the buffer 202 may be fully filled. At time point D (40 ms), the buffer 204 may be fully filled. The buffer 202 and the buffer 204 work alternately.

At the time point A (10 ms), when the buffer 202 may be fully filled from empty, the DSP 105 can check whether there is a full zero-crossing cycle data collected. There may be no full zero-crossing data collected at time point A.

At the time point B (20 ms), when the buffer 204 is fully filled from empty, the DSP 105 can check whether there is a full zero-crossing cycle data collected. There may be a first full zero-crossing data (from ZC1 to ZC2) collected at the time point B. At time point B, the DSP 105 can calculate the power for the first full zero-crossing data and may obtain one power value, P1. In the CP402, the energy E1 for the first full zero-crossing data can also be calculated at time point B as follows:

$$E1=P1\times T_{ZC1\text{-}ZC2}$$

Where $T_{ZC1\text{-}ZC2}$ represents the period between point ZC1 and ZC2.

The energy $E_{ZC2\text{-}B}$ consumed during the period between point ZC2, and B may be predicted as follows:

$$E_{ZC2\text{-}B}=P1\times T_{ZC2\text{-}B}$$

In the CP402, the accumulated energy E71 at the point B from the point O can be calculated as follows:

$$E71=E1+E_{ZC2\text{-}B}=P1\times T_{ZC1\text{-}ZC2}+P1\times T_{ZC2\text{-}B}$$

At the time point C (30 ms), the DSP 105 can check whether there is another full zero-crossing cycle data collected. There may be no full zero-crossing data collected at the time point C. The energy $E_{ZC2\text{-}C}$ consumed during the period between point ZC2, and C may be predicted as follows:

$$E_{ZC2\text{-}C}=P1\times T_{ZC2\text{-}C}$$

In the CP402, the accumulated energy E72 at the point C from the point O can be calculated as follows:

$$E72=E1+E_{ZC2\text{-}C}=P1\times T_{ZC1\text{-}ZC2}+P1\times T_{ZC2\text{-}C}$$

At the time point D (40 ms), the DSP 105 can check whether there is another full zero-crossing cycle data collected. There may be a second full zero-crossing data (from ZC2 to ZC3) gathered at the time point D. At time point D, the DSP 105 can calculate the power for the second full zero-crossing data and may obtain one power value, P2. The energy E2 for the second full zero-crossing data can also be calculated at time point D as follows:

$$E2=P2\times T_{ZC2\text{-}ZC3}$$

The energy $E_{ZC3\text{-}D}$ consumed during the period between point ZC3, and D can be predicted as follows:

$$E_{ZC3\text{-}D}=P1\times T_{ZC3\text{-}D}$$

In the CP402, the accumulated energy E73 at the point D from the point O can be calculated as follows:

$$E73=E1+E2+E_{ZC3\text{-}D}=P1\times T_{ZC1\text{-}ZC2}+P2\times T_{ZC2\text{-}ZC3}+P2\times T_{ZC3\text{-}D}$$

At the time point E (50 ms), the DSP 105 can check whether there is a full zero-crossing cycle data collected. There may be no full zero-crossing cycle data collected at the time point E. The energy $E_{ZC3\text{-}E}$ consumed during the period between point ZC3, and E can be predicted as follows:

$$E_{ZC3\text{-}E}=P2\times T_{ZC3\text{-}E}$$

In the CP402, the accumulated energy E74 at the point E from the point O can be calculated as follows:

$$E74=E1+E2+E_{ZC3\text{-}E}=P1\times T_{ZC1\text{-}ZC2}+P2\times T_{ZC2\text{-}ZC3}+P2\times T_{ZC3\text{-}E}$$

At the time point F (60 ms), the DSP 105 can check whether there is a full zero-crossing cycle data collected. There may be a third full zero-crossing data collected at the time point F (from ZC3 to ZC4). the DSP 105 can calculate the power for the third full zero-crossing data and may obtain one power value P3. The energy E3 for the third full zero-crossing data can also be calculated at the time point F.

$$E3=P3\times T_{ZC3\text{-}ZC4}$$

The energy $E_{ZC4\text{-}F}$ consumed during the period between point ZC4, and F may be predicted as follows:

$$E_{ZC4\text{-}F}=P3\times T_{ZC4\text{-}F}$$

In the CP402, the accumulated energy E75 at the point F from the point O can be calculated as follows:

$$E75=E1+E2+E3+E_{ZC4\text{-}F}=P1\times T_{ZC1\text{-}ZC2}+P2\times T_{ZC2\text{-}ZC3}+P3\times T_{ZC3\text{-}ZC4}+P3\times T_{ZC4\text{-}F}$$

At the time point G (70 ms), the DSP 105 can check whether there is a full zero-crossing cycle data collected. There may be a fourth full zero-crossing data collected at the time point F (from ZC4 to ZC5). The DSP 105 can calculate the power for the fourth full zero-crossing data and may obtain one power value P4. In the CP402, the energy E4 for the fourth full zero-crossing data can also be calculated at the time point G.

$$E4=P4\times T_{ZC4\text{-}ZC5}$$

The energy $E_{ZC5\text{-}G}$ consumed during the period between point ZC5, and G may be predicted as follows:

$$E_{ZC5\text{-}G}=P4\times T_{ZC5\text{-}G}$$

In the CP402, the accumulated energy E76 at the point G from the point O can be calculated as follows:

$$E75=E1+E2+E3+E4+E_{ZC5\text{-}G}=P1\times T_{ZC1\text{-}ZC2}+P2\times T_{ZC2\text{-}ZC3}+P3\times T_{ZC3\text{-}ZC4}+P4\times T_{ZC4\text{-}ZC5}+P4\times T_{ZC5\text{-}G}$$

IED 100 can generate an energy pulse output according to a pre-determined threshold and the totalized energy consumption. For example, if E75 or E76 may be greater than the pre-determined threshold, an energy pulse output can be generated and output.

Embodiments of the teachings of the present disclosure have been described in an illustrative manner. It is to be understood that the terminology that has been used, may be intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. An intelligent electronic device (IED) comprising:
    at least one sensor configured for sensing at least one electrical parameter of electrical power distributed from an electrical distribution system to a load;
    at least one analog-to-digital converter coupled to the at least one sensor and configured for converting an analog signal output from the at least one sensor to digital data; and
    at least one processing module coupled to the at least one analog-to-digital converter and configured to:
        receive digital electrical parameter data into at least two buffers alternately,
    wherein each of the at least two buffers is a circular buffer;
    determine whether the digital electrical parameter data for a full zero-crossing cycle is included in the at least two buffers when one of the at least two buffers gets fully filled with the digital electrical parameter data, wherein the full zero-crossing cycle corresponds to two consecutive zero crossing points of an electrical signal associated with the electrical power with a same zero-crossing type;
        compute a power value based on the digital electrical parameter data when the one of the at least two buffers gets fully filled and store the power value, wherein the power value is computed if the digital electrical parameter data for the full zero-crossing cycle is included in the at least two buffers when the one of the at least two buffers gets fully filled with the digital electrical parameter data;
        divide a period that each buffer takes from being empty to getting fully filled into a series of intervals, wherein the period is no more than 10 milliseconds, wherein the series of intervals is at least two intervals;
        calculate energy consumption in each interval based on the power value stored;
        totalize the energy consumption; and
        generate an energy pulse output according to a pre-determined threshold and the totalized energy consumption.

2. The IED of claim 1, wherein the digital electrical parameter data include at least one of:
    phase voltage data; and
    phase current data.

3. The IED of claim 1, wherein the power value is one of:
    an active power value;
    a reactive power value; and
    an apparent power value.

4. The IED of claim 1, wherein a means for dividing a period that each buffer takes from empty to getting fully filled into a series of intervals includes:
    setting at least one timer for at least one time point in the period that each buffer takes from being empty to getting fully filled, wherein the at least one time point divides the period into the series of intervals; and
    triggering an interrupt when the at least one timer expires, wherein the power value is calculated based on the interrupt.

5. A method for generating an energy pulse output in an IED, the method comprising:
    receiving digital electrical parameter data into at least two buffers alternately,
    wherein each of the at least two buffers is a circular buffer;
    determining whether the digital electrical parameter data for a full zero-crossing cycle is included in the at least two buffers when one of the at least two buffers gets fully filled with the digital electrical parameter data, wherein the full zero-crossing cycle corresponds to two consecutive zero crossing points of an electrical signal associated with the electrical power with a same zero-crossing type;
        computing a power value based on the digital electrical parameter data when the one of the at least two buffers gets fully filled and storing the power value, wherein the power value is computed if the digital electrical parameter data for the full zero-crossing cycle is included in the at least two buffers when the one of the at least two buffers gets fully filled with the digital electrical parameter data;
        dividing a period that each buffer takes from being empty to getting fully filled into a series of intervals, wherein the period is no more than 10 milliseconds, wherein the series of intervals is at least two intervals;
        calculating energy consumption in each interval based on the power value stored;
        totalizing the energy consumption; and
        generating an energy pulse output according to a pre-determined threshold and the totalized energy consumption.

6. The method of claim 5, wherein the digital electrical parameter data include at least one of:
    phase voltage data; and
    phase current data.

7. The method of claim 5, wherein the power value is one of:
- an active power value;
- a reactive power value; and
- an apparent power value.

8. The method of claim 5, wherein dividing a period that each buffer takes from empty to getting fully filled into a series of intervals includes:
- setting at least one timer for at least one time point in the period that each buffer takes from being empty to getting fully filled, wherein the at least one time point divides the period into the series of intervals; and
- triggering an interrupt when the at least one timer expires, wherein the power value is calculated based on the interrupt.

* * * * *